(12) United States Patent
Gogotsi et al.

(10) Patent No.: US 6,740,403 B2
(45) Date of Patent: May 25, 2004

(54) GRAPHITIC POLYHEDERAL CRYSTALS IN THE FORM OF NANOTUBES, WHISKERS AND NANORODS, METHODS FOR THEIR PRODUCTION AND USES THEREOF

(75) Inventors: Yury Gogotsi, Ivyland, PA (US); Joseph A. Libera, Clarendon Hills, IL (US); Masahiro Yoshimura, Kanagawa (JP)

(73) Assignee: Toyo Tanso Co., Ltd., Osaka (JP); part interest ( * ) Notice: Subject to any disclaimer, the term of this patent is extended or adjusted under 35 U.S.C. 154(b) by 320 days.

(21) Appl. No.: 09/822,355

(22) Filed: Apr. 2, 2001

(65) Prior Publication Data

US 2002/0141934 A1 Oct. 3, 2002

(51) Int. Cl.$^7$ .................................................. D01F 9/12
(52) U.S. Cl. ................. 428/367; 423/447.2; 423/445 R; 423/448
(58) Field of Search .......................... 423/447.1, 447.2, 423/445 R, 448; 428/367

(56) References Cited

U.S. PATENT DOCUMENTS

| | | | |
|---|---|---|---|
| 3,702,054 A | * 11/1972 | Araki et al. ................... 57/282 |
| 5,149,584 A | 9/1992 | Baker et al. |
| 5,346,683 A | 9/1994 | Green et al. |
| 5,456,986 A | 10/1995 | Majetich et al. |
| 5,457,343 A | 10/1995 | Ajayan et al. |
| 5,458,784 A | 10/1995 | Baker et al. |
| 5,460,705 A | 10/1995 | Murphy et al. |
| 5,476,679 A | 12/1995 | Lewis et al. |
| 5,482,601 A | 1/1996 | Ohshima et al. |
| 5,543,378 A | 8/1996 | Wang |
| 5,547,748 A | * 8/1996 | Ruoff et al. ................. 428/323 |
| 5,560,898 A | 10/1996 | Uchida et al. |
| 5,626,650 A | 5/1997 | Rodriguez et al. |
| 5,627,140 A | 5/1997 | Fossheim et al. |
| 5,641,466 A | 6/1997 | Ebbesen et al. |
| 5,648,056 A | 7/1997 | Tanaka |
| 5,648,569 A | 7/1997 | Corbin et al. |
| 5,653,951 A | 8/1997 | Rodriguez et al. |
| 5,695,734 A | 12/1997 | Ikazaki et al. |
| 5,698,175 A | 12/1997 | Hiura et al. |
| 5,753,088 A | 5/1998 | Olk |
| 5,773,834 A | 6/1998 | Yamamoto et al. |
| 5,780,101 A | 7/1998 | Nolan et al. |
| 5,800,706 A | 9/1998 | Fischer |
| 5,814,290 A | 9/1998 | Niu et al. |
| 5,824,470 A | 10/1998 | Baldeschwieler et al. |
| 5,865,036 A | 2/1999 | Anthony |
| 5,866,434 A | 2/1999 | Massey et al. |
| 5,868,850 A | 2/1999 | Ichishima et al. |
| 5,889,372 A | 3/1999 | Beeteson et al. |
| 5,908,692 A | 6/1999 | Hamers et al. |
| 5,916,642 A | 6/1999 | Chang |
| 5,933,791 A | 8/1999 | Hamada et al. |
| 5,946,930 A | 9/1999 | Anthony |
| 5,948,465 A | 9/1999 | Blanchet-Fincher et al. |
| 5,985,232 A | 11/1999 | Howard et al. |
| 5,993,596 A | 11/1999 | Uwai et al. |
| 6,002,471 A | 12/1999 | Quake |
| 6,017,390 A | 1/2000 | Charych et al. |
| 6,020,747 A | 2/2000 | Bahns et al. |
| 6,038,060 A | 3/2000 | Crowley |
| 6,041,600 A | 3/2000 | Silverbrook |
| 6,057,637 A | 5/2000 | Zettl et al. |
| 6,066,448 A | 5/2000 | Wohlstadter et al. |
| 6,090,363 A | 7/2000 | Green et al. |
| 6,090,545 A | 7/2000 | Wohlstadter et al. |
| 6,097,138 A | 8/2000 | Nakamoto |
| 6,099,965 A | 8/2000 | Tennent et al. |
| 6,113,807 A | 9/2000 | Yamaura et al. |
| 6,129,901 A | 10/2000 | Moskovits et al. |
| 6,139,919 A | 10/2000 | Eklund et al. |
| 6,140,045 A | 10/2000 | Wohlstadter et al. |
| 6,157,043 A | 12/2000 | Miyamoto |
| 6,159,538 A | 12/2000 | Rodriguez et al. |
| 6,162,411 A | 12/2000 | Howard et al. |

OTHER PUBLICATIONS

Liu et al. "Structures of carbon nanotubes studied by HRTEM and nanodiffraction", 1994, Ultramicroscopy vol. 53, pp. 333–342.*
S. Ohtani, et al., "Glass–Like Carbons", Department of Materials Science, Cunma University, Gunma, Japan, pp. 550–572.

* cited by examiner

Primary Examiner—Stuart L. Hendrickson
Assistant Examiner—Peter J Lish
(74) Attorney, Agent, or Firm—Oblon, Spivak, McClelland, Maier & Neustadt, P.C.

(57) ABSTRACT

Isolated graphitic polyhedral crystal and methods for their isolation are provided wherein the crystals have graphite sheets arranged in a plurality of layers to form an elongated structure having a long axis and a diameter and having 7 or more external facets running substantially the length of the long axis, and take a variety of forms, such as needles, giant nanotubes, nanorods, whiskers, rings, cones, double tipped pyramids and others, as well as their use in a variety of nanoscale devices and endproducts.

33 Claims, 5 Drawing Sheets

GRAPHITIC POLYHEDERAL CRYSTALS IN THE FORM OF NANOTUBES, WHISKERS AND NANORODS, METHODS FOR THEIR PRODUCTION AND USES THEREOF

BACKGROUND OF THE INVENTION

1. Field of the Invention

The present invention relates to graphitic polyhedral crystals that take the form of carbon nanotubes, carbon whiskers or nanorods and have a polyhedral cross section, a variety of uses thereof, and methods for their production from glassy carbon starting materials.

2. Description of the Related Art

Both graphite whiskers (R. Bacon, *J. Appl. Phys.* 31, 283–290 (1960)) and carbon nanotubes (S. Iijima, *Nature* 354, 56–58 (1991)) represent unusual forms of carbon based on the distortion of graphene sheets. Conventional graphite forms hexagonal plate-like crystals with a very weak bonding between graphene layers. Graphite whiskers, in which a graphene sheet rolls into a scroll, provide a benchmark against which the performance of carbon fibers is compared. The discovery of carbon nanotubes demonstrated the possibility of making strong graphite crystals consisting of coaxial closed tubes and challenged the position of whiskers as the strongest material known.

Polyhedral carbon nanotubes have been reported (P. M. Ajavan, in *Carbon Nanotubes: Preparation and Properties* T. W. Ebbesen, Ed. (CRC Press, Boca Raton, Fla., 1997) pp. 111–138; M. S. Dresselhaus et al, *Science of Fullerens and Carbon Nanotubes* (Academic Press, 1996); S. Iijima et al, *Phys.Rev.Lett.* 69, 3100–3103 (1992); S. Iijima, *MRS Bull.* 19, 43–49 (1994)), but did not receive much attention. To date, only 5 and 6 membered polyhedral structures have been reported. A theoretical treatment of the electronic properties of polygonized carbon nanotubes has also appeared, but included only ab initio calculations of the electronic properties based upon hybridization effects, particularly in zigzag nanotubes having high curvature near the edges of the polygonal cross-section prism (J.-C. Charlier et al, *Phys. Rev. B,* 54(12), R8377–R8380 (1996)). Faceting of vapor-grown carbon fibers occurs after heating to 3000° C. (M. Endo et al, in *Carbon Nanotubes* T. W. Ebbesen, Ed. (CRC Press, Boca Raton, 1997) pp. 35–110). Of all carbon fibers, those are the closest to crystalline graphite in crystal structure and properties. However, faceted carbon whiskers have not been reported. Partial graphitization and formation of polygons was observed after heat treatment of carbon black at 2800° C. (Endo et al). Polyhedral nanoparticles (5–30 nm) made of concentric layers of closed graphene sheets and having a nanoscale cavity in the center were produced at very high temperatures in arc plasma (D. Ugarte, in *Carbon Nanotubes* M. Endo, S. Iijima, M. S. Dresselhaus, Eds. (Pergamon, Oxford, 1996) pp. 163–1679). They provided further evidence that non-planar graphite crystals can exist. However, transformation of carbon polyhedra to onions under electron irradiation suggested their instability. No other polyhedral carbon structures have been reported so far.

Carbon whiskers and nanotubes have received a high level of attention in recent years, for their use as nanometer-scale microscopy probes (Lieber et al, U.S. Pat. No. 6,159,742; Baldeschwieler et al, U.S. Pat. No. 5,824,470), as materials in thermal composites, reinforcement composites and magnetic particle recording media (Nolan et al, U.S. Pat. Nos. 5,780,101 and 5,965,267), as field emission tips in field emission devices and flat panel displays (Park et al, U.S. Pat. No. 6,019,656), in the production of electrodes for electrochemical capacitors (Tennent et al, U.S. Pat. No. 6,031,711), as emitters in cold cathode emitter structures (Chuang et al, U.S. Pat. No. 6,062,931), as functional elements in MEMS devices (Mancevski, U.S. Pat. No. 6,146,227), as quantum wires in a quantum wire switch (Flory et al, U.S. Pat. No. 5,903,010), in the production of miniaturized solenoids for the production of strong magnetic fields using weak current on a small scale (Miyamoto, U.S. Pat. No. 6,157,043), to produce micro or nanoscale electrical contact probes (Bahns et al, U.S. Pat. No. 6,020,747), as well as others.

However, one difficulty in the previously isolated nanotubes and carbon whiskers has been the ability to manipulate the circular cylindrical shapes of submicrometer diameter readily, or in the case of the polygonal nanotubes previously found, to avoid the instability noted above. A further difficulty found in working with nanotubes or carbon whiskers having a circular cross section is the tendency of the cylinder to undergo separation and telescoping of the various layers of graphene sheet walls.

SUMMARY OF THE INVENTION

Accordingly, one object of the present invention is to provide graphitic polyhedra structures that have increased stability and improved manipulability relative to circular cylindrical structures.

A further object of the present invention is to provide polyhedral cross-section nanotubes or carbon whiskers having significantly increased strength and structural integrity relative to those with circular cross sections.

A further object of the present invention is to provide a method for the production of such graphitic polyhedra, particularly polyhedral cross-section nanotubes and carbon whiskers.

A further object of the present invention is to provide a nanotube or carbon whisker having a polyhedral cross-section and having a twist along the long axis to provide even higher structural integrity and strength.

These and other objects of the present invention have been satisfied by the discovery of an isolated graphitic polyhedral crystal comprising graphite sheets arranged in a plurality of layers to form an elongated structure having a long axis and a diameter and having 7 or more external facets running substantially the length of the long axis, a method for the isolation of such graphitic polyhedral crystals and their use in a variety of nanoscale devices.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

The present invention relates to new graphitic polyhedral structures discovered in micrometer-sized pores of a common carbon material, known as glassy carbon (GC). While various particles have been detected in micropores of GC previously, there has been no report of the shape or structure of these particles (A. S. Fialkov, *Carbon, Intercalation Compounds and Composites on Its Base* (*in Russian*) (Aspect Press, Moscow, 1997)). Raman spectra suggested formation of graphitic carbon in pores of GC (K. Ray, III et al, *Anal. Chem.* 69, 4680–4687 (1997)).

Figure 4:
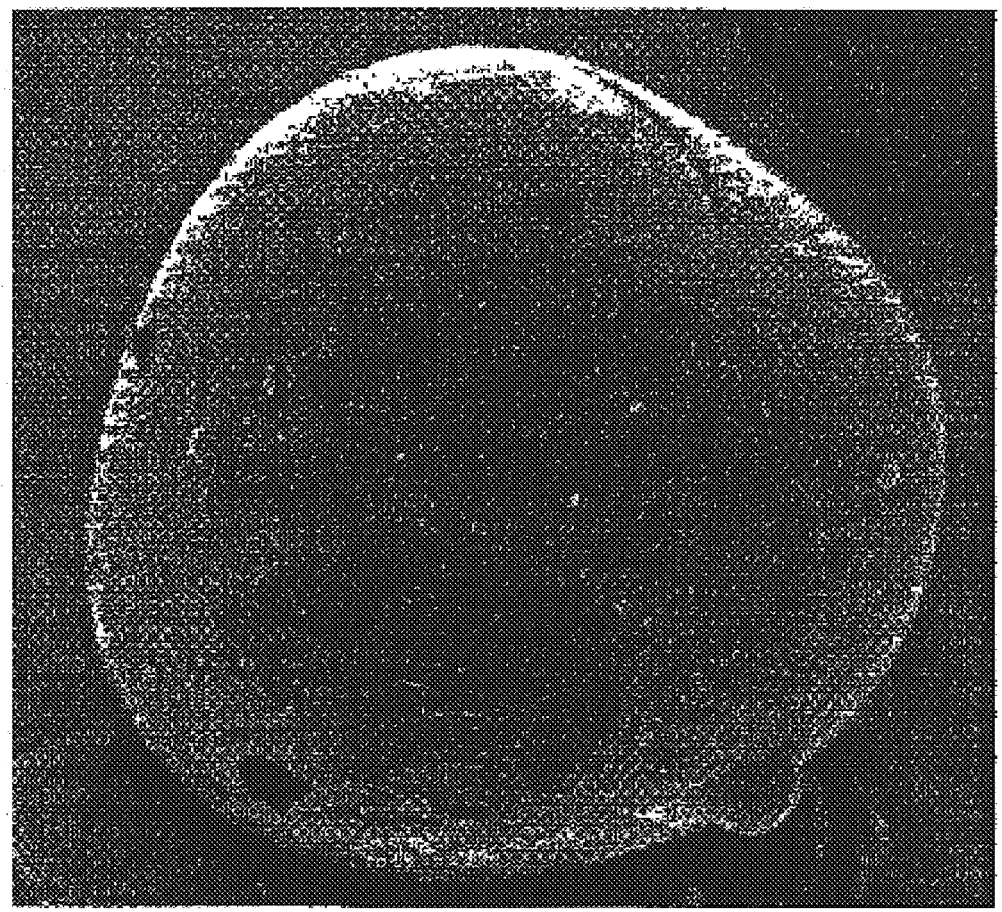
FIG. 4 shows an example of one of the encapsulated pores isolated from the matrix after hydrothermal treatment.
Figure 5:
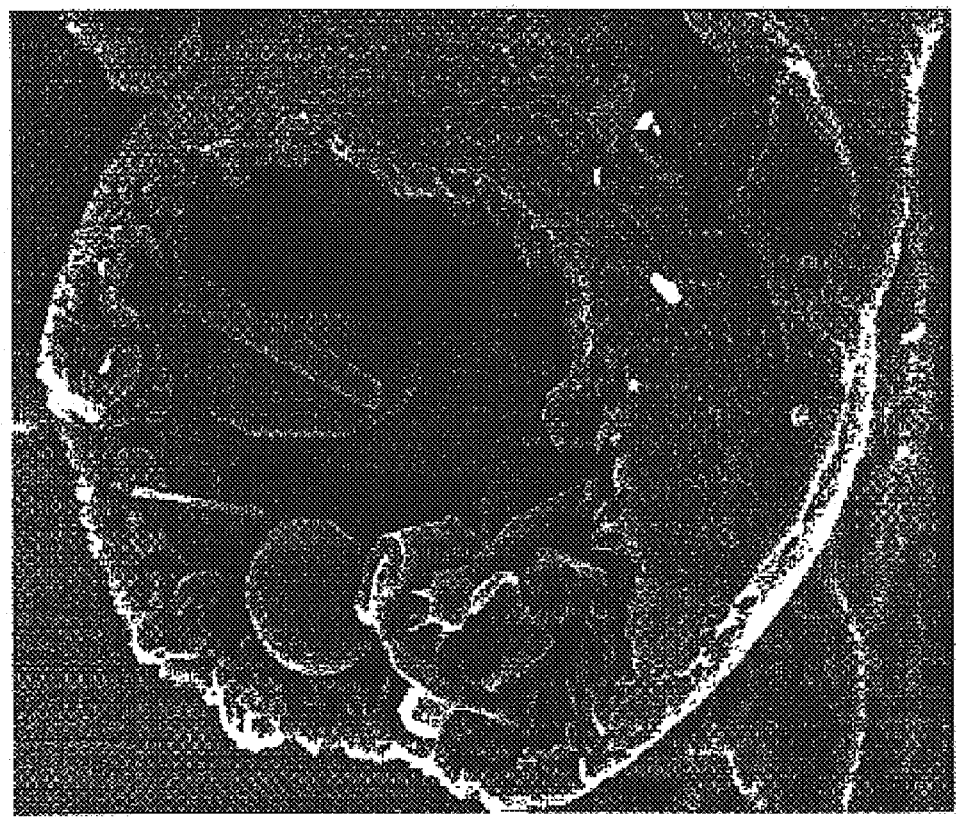
FIG. 5 shows an example of a fractured pore having the graphitic polyhedral crystals of the present invention therein.

The present invention was discovered upon isolation and analysis of polyhedral carbon structures found in micropores of a high temperature glassy carbon, particularly the high temperature glassy carbon sold as GL-200 (obtainable from Toyo Tanso Co., Japan). High temperature GC (prepared under conditions of about 2000° C. or higher) is the most readily used starting material for obtaining the graphitic polyhedral crystals of the present invention. However, even though a low temperature (prepared under conditions of less than about 2000° C.) GC was examined and found to contain none of the graphitic polyhedra of the present invention, this does not rule out their presence in some low temperature GC's. However, the high temperature GC's are preferred. The polyhedral carbon structures can be isolated by hydrothermal treatment of the GC, preferably under supercritical water conditions. The GC is treated by submission to water at a temperature and pressure sufficient to dissolve the matrix of the GC to leave encapsulated pores. FIG. 4 shows an example of one of the encapsulated pores isolated from the matrix after hydrothermal treatment. The treatment is preferably at a temperature from 300° C. to 1000° C., more preferably from 500° C. to 850° C., and preferably at a pressure of 1 atm to 2000 atm, more preferably from 100 atm to 800 atm. The treatment is performed for a time period sufficient to remove the matrix, preferably from 1 to 100 hrs, more preferably from 5 to 20 hours. The resulting encapsulated pores are then fractured to expose the graphitic polyhedra contained therein, readily allowing their isolation by mechanical means, such as ultrasonication and subsequent decanting or filtering. FIG. 5 shows an example of a fractured pore having the graphitic polyhedral crystals of the present invention therein.

Figure 1:
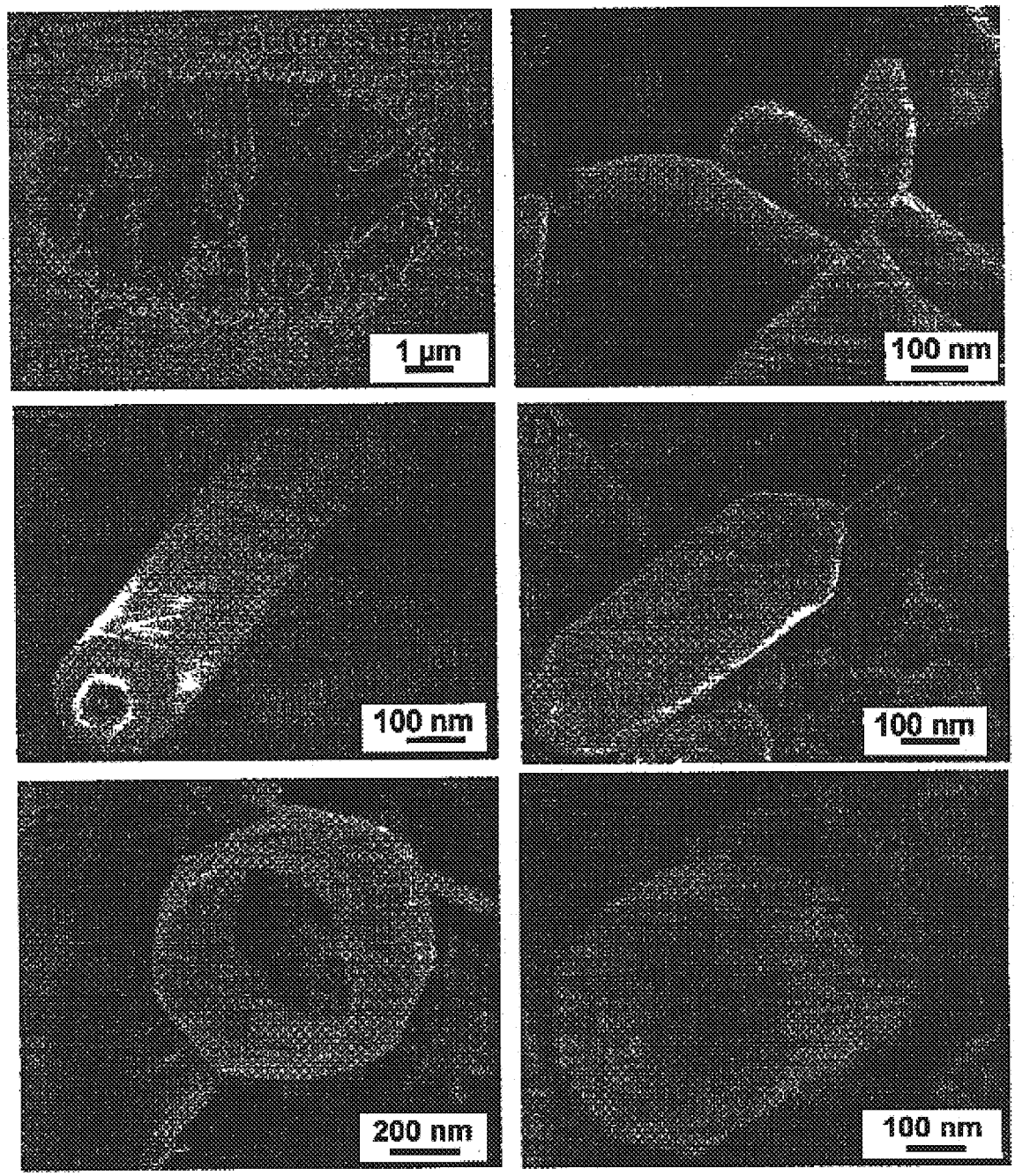
FIG. 1A is an SEM photograph of a glassy carbon pore fracture surface showing carbon nanotubes and graphitic polyhedral crystals of the present invention growing in the pore.
FIG. 1B is an SEM photograph showing graphitic polyhedral crystals in the form of carbon nanotube (1), double cone (2) and microrod (3) structures.
FIG. 1C is an SEM photograph of a graphitic polyhedral crystal of the present invention having a helical twist along the long axis and a heptagonal cross section.
FIG. 1D is an SEM photograph of a graphitic polyhedral crystal of the present invention having a helical twist and a protruding nanotube from one end, suitable for use as a nanoprobe.
FIG. 1E is an SEM photograph of a graphitic polyhedral crystal of the present invention in the form of a ring.
FIG. 1F is an SEM photograph of a graphitic polyhedral crystal of the present invention having a helical twist and a notch transversally across the structure, possibly formed from crossing with another nanostructure inside the pore, then removed upon fracture of the pore.
Figure 2:
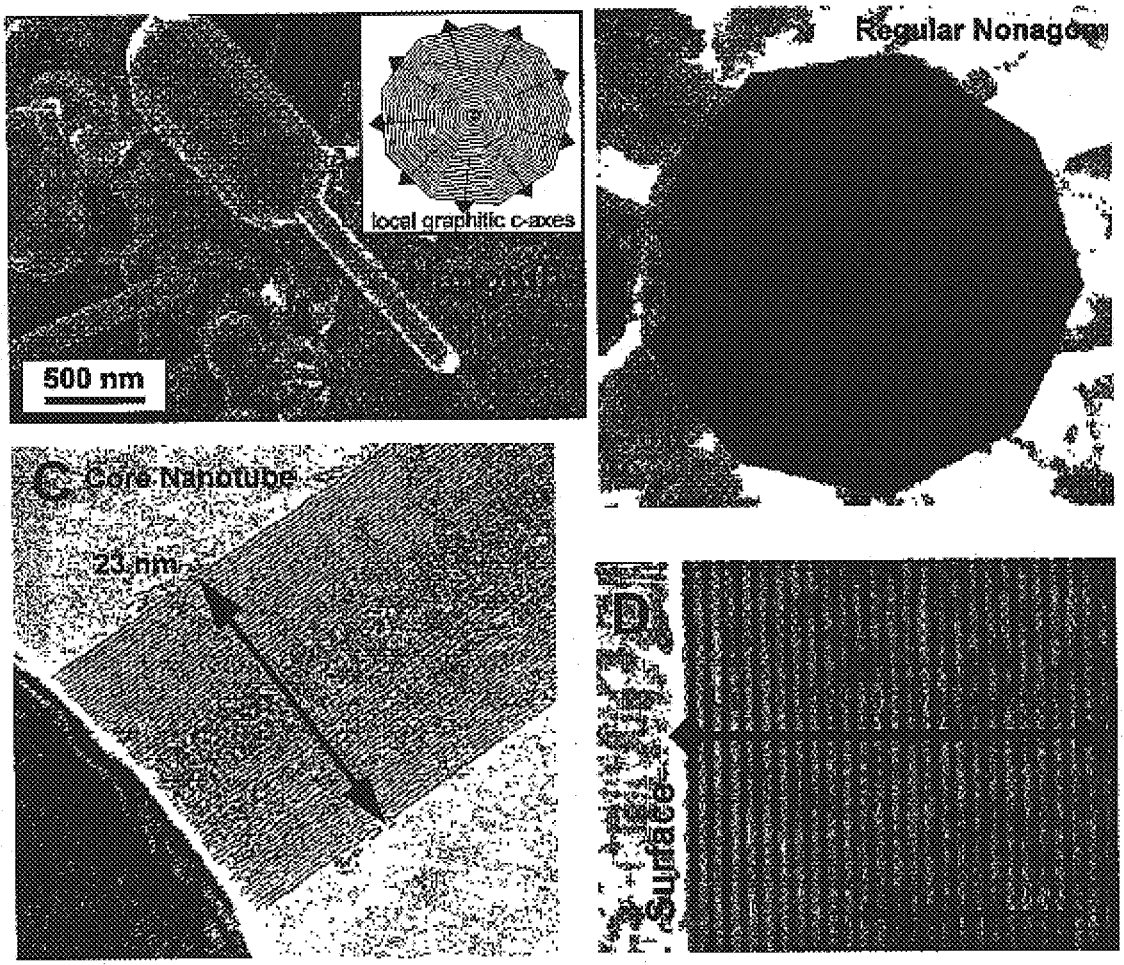
FIG. 2A is an SEM photograph of a stylus-like crystal of the present invention with a nanotube protruding from the tip. The inset shows a schematic of the GPC cross section.
FIG. 2B is an SEM photograph of the cross section of a GPC of the present invention having a near regular nonagon cross section.
FIG. 2C is a TEM image of a nanotube tip of the present invention.
FIG. 2D is a TEM image showing a typical lattice fringe image of the wall taken close to the surface along the axis of a GPC of the present invention, showing a well-ordered graphitic structure with interplanar spacing of <0.34 nm.

In the present invention, fracture of the glassy carbon starting material reveals pores, which split along the fracture surface (FIG. 1A). The pores contain unique crystal shapes (FIG. 1), which consist of pure carbon and possess interbonded basal planes that are at fixed angles to each other. These objects are herein described as graphite polyhedra. Transmission electron microscopy (TEM) studies confirm the ordered graphitic structure of these objects (FIG. 2). These graphitic polyhedra have a diameter that ranges from 10 nm to 1 $\mu$m, and are found to have lengths of from 100 nm to 5 $\mu$m. However, the graphitic polyhedra of the present invention can also be bigger, either in diameter or length or both, simply by altering the conditions of formation of the GC or altering the conditions of hydrothermal treatment. Accordingly, the present invention structures are not limited to the above noted size ranges, but include both smaller and larger graphitic polyhedral crystals.

As noted above, the structures of the present invention are preferably obtained from high temperature glassy carbon products. However, the graphitic polyhedral crystals may also be prepared under high pressure/high temperature conditions (mimicking those of the production and hydrothermal treatment of glassy carbon products) from the vapor phase, using a starting material containing carbon, hydrogen and oxygen. The starting gas can be in the vapor state or contain hydrocarbon molecules or ions of the desired elements, either cationic or anionic. Catalyst may be used as in conventional nanotube synthesis. Preferred temperatures are those of 2000° C. or higher, at preferred pressures being from 1 to 2000 atm, more preferably from 100 atm to 800 atm. Under such conditions, a high pressure vessel would be necessary for the reaction. Any conventional high pressure autoclave or reaction vessel would be sufficient. Those made of metal or metal lined could even act as the catalyst for beginning of the crystals.

The graphitic polyhedra of the present invention can take many forms, including but not limited to needles, giant nanotubes, rings, cones, double tipped pyramids, nanorods or whiskers. Polyhedral carbon nanotubes of the present invention preferably have a cross-sectional diameter from 5 to 100 nm, more preferably from 10 to 50 nm (FIGS. 1, B and D). Nanorods or whiskers of the present invention can have constant (FIG. 1C) or variable (FIGS. 1B,D) cross-sections of 100 to 1000 nm, preferably from 500 to 1000 nm. Additionally, the polyhedra can take the form of faceted carbon rings (FIG. 1E), resembling a nanorod or nanotube from which the core has been removed.

Most unique about these graphitic polyhedra is the multi faceted nature of the cross-sectional shape. The structures have different interplanar angles and the number of facets can range from 7 to 14, preferably 7, 9 and 11. The graphitic polyhedra of the present invention can be axially true (FIG. 2A) in which the facets intersect to form "ridges" along the axial direction of the nanotube/nanorod/whisker. Alternatively, the graphitic polyhedra of the present invention can actually have a helical twist wherein the "ridges" formed by the intersection of the facets undergo at least a partial rotation about the axis as one travels the length of the structure (FIGS. 1C,D). Analysis of the structures by cross-sectional TEM shows that these structures preferably have a regular crystal shape with equal faces (FIG. 2B) within up to 1% accuracy. Most preferred structures are the structures having seven-fold (FIG. 1C), and nine-fold (FIGS. 1F and 2A) symmetries, although more complex symmetries are also included and have been observed.

The resulting graphitic polyhedra come in a variety of forms as noted above. Preferred forms of the graphitic polyhedra are rod- or barrel-shaped crystals ending with a thin protruding needle (FIGS. 1D and 2A). Although not wanting to be limited thereto, these structures appear to be a multiwalled nanotube (FIG. 2C), with a core diameter of about 5 to 20 nm and a conical, dome-capped or semitoroidal tip. Some needles show a contrast imbalance and asymmetric fringing in TEM that do not match the cylindrical tube model and demonstrate polyhedral geometry. It has been suggested that polygonization of nanotubes should occur as the size gets larger. However, the regular shape of the graphitic polyhedra of the present invention shows that folding of the carbon cylinders was not stochastic, but followed certain crystallographic principles (fixed angles and/or number of facets). Semitoroidal capsules growing on nanotube cores have been previously reported. However, in the present invention structures, a surprisingly large number of ordered carbon layers (up to 1500!) (FIG. 2D) can be preferably found on the core nanotube, resulting in complex axis-symmetric structures never before reported. The crystal habits of the graphitic polyhedra of the present invention are thought to be based on the molecular symmetry of their nanotube cores, which are reported to have variable screw-axis structure.

Figure 3:
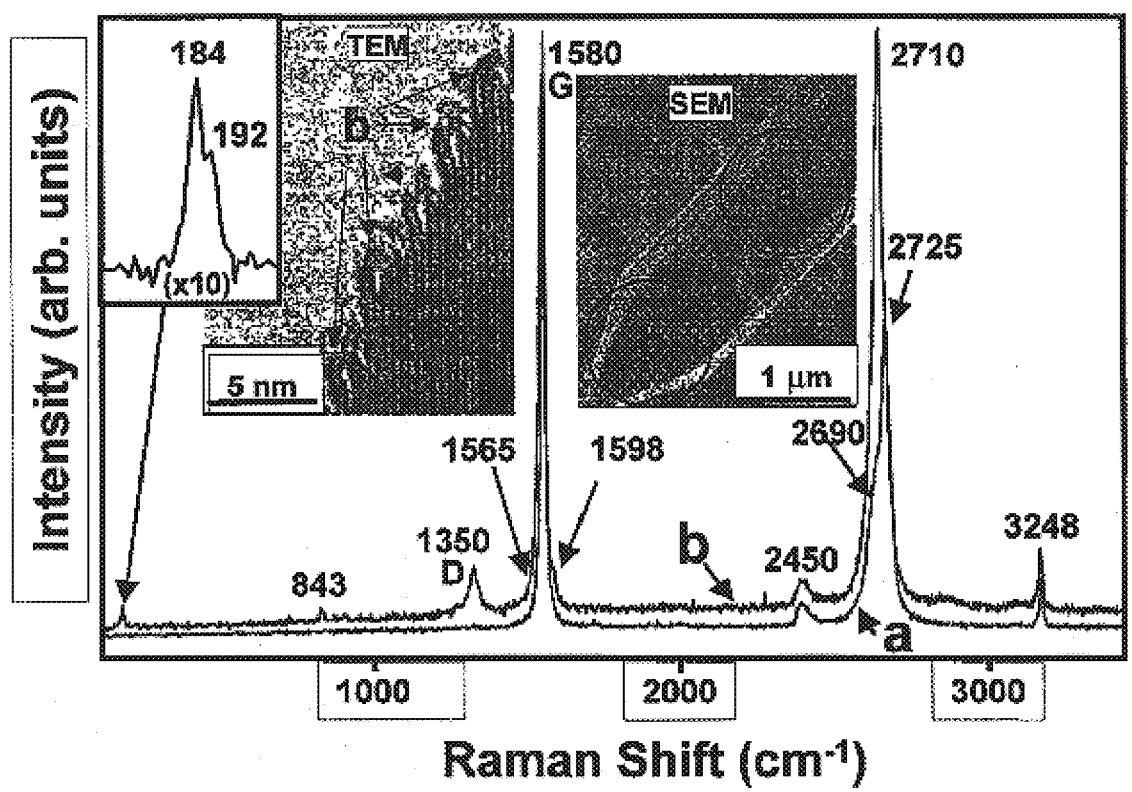
FIG. 3 shows first and second order Raman spectra obtained from (a) the faceted part and (b) the tip of a GPC of the present invention, shown in the inset SEM photograph.

The starting material GC matrix is non-graphitic and produces broad D and G Raman bands of about the same intensity whereas the pores show highly graphitic material with a weak D-band and a narrow G-band. The graphitic polyhedra of the present invention were located and identified morphologically using microscopy (both light and scanning electron microscopy or SEM) by a distinct aspect ratio of G and D bands in Raman spectra typical for that of graphite ($I_D/I_G<0.1$). Measurement of the individual Raman spectra of the various graphitic polyhedra (see FIG. 3) shows submicrometer-sized structures that are graphitic with the extincting D-band and the G-band of about the same width (full-width at half-maximum (FWHM)=14 cm$^{-1}$) as in crystals of natural graphite. This is believed to be due to a smaller number of terminated graphene planes in the graphitic polyhedra of the present invention compared to a graphite crystal of the same size. FIG. 3 shows selective micro-Raman analysis of the largest of the more preferred graphitic polyhedral crystals from the side face (FIG. 3, spectrum a) and from the tip (FIG. 3, spectrum b). Spectra from the crystal faces of these preferred embodiments correspond to perfect graphite with a narrow G-band and no D-band, as expected from TEM analysis of the faces (FIG. 2D). Spectra from the tips of these preferred embodiments (FIG. 3, spectrum b) feature an unusually strong second order 2700 cm$^{-1}$ band, that exceeds in intensity the G-band of graphite, and a number of weak bands, including a clearly pronounced doublet at 184/192 cm$^{-1}$, which is in a fairly good agreement with spectra from single-walled nanotubes (cf. A. M. Rao et al., *Science* 275, 187–190 (1997)). Such spectra, similar to a breathing mode of single-wall nanotubes, are believed to result from all of the dangling bonds being eliminated by the formation of bent graphitic layers, as shown in FIG. 3 (TEM insert). The curvature of the outer layer (1.5 nM) is in good agreement with the average diameter of single-wall nanotubes, and the diameter of the inner loop of 0.6 nm is smaller than that of $C_{60}$-capped nanotubes. A similar process of elimination of dangling bonds and formation of curved edges has been previously observed after heat treatment of oxidation-opened nanotubes at 2000° C. (D. Ugarte et al, in *The Science and Technology of Carbon Nanotubes* K. Tanaka, T. Yamabe, K. Fukui, Eds. (Elsevier, Amsterdam, 1999) pp. 128–142)), or filamentous graphite at 2800° C. (H. Murayama et al, *Nature* 345, 791–793 (1990)). Well-defined curved termination of graphite sheets has also been previously reported for carbon cones synthesized at 2200° C. (H. Murayama et al). However, based on Raman spectra (narrow G-band, no D-band and close to perfect graphite second order spectrum) and TEM, the graphitic polyhedra of the present invention have a higher perfection than multiwalled nanotubes or graphite whiskers, which always show a distinct D-band.

Unlike carbon fibers graphitized at 3000° C., the graphitic polyhedra of the present invention do not appear to have disordered carbon interlayers. Examination of the structures of the present invention treated in supercritical water revealed no etching along the facet intersections which suggests continuity of the graphene layers. However, some slow etching along graphene planes terminations can be observed, as would be expected for the loop structures. Not coincidentally, the structures of the present invention exhibit no evidence of Raman bands at 184/192 cm$^{-1}$ in the treated samples. Moreover, unlike polygonized carbon black particles, the graphitic polyhedra of the present invention do not have conventional grain boundaries, because those would produce a strong D-band in the Raman spectra. An excellent confirmation of non-random growth and faceting of the graphitic polyhedra of the present invention is provided by FIG. 1F. Interrupted growth of a twisted GPC, caused by another crystal crossing with the original crystal in the initial stage of growth, continues after the cavity resulting in the same number of facets, as occurs in the growth of crystallographically true crystals. Thus, the growth of the graphitic polyhedra is found to follow axial morphological (Fourier) symmetry. Only a very few inorganic materials form low-dimensional tube-type crystals. Examples are cylindrical crystals of serpentine (E. J. W. Wittaker, *Acta Cryst.* 21, 461–466 (1966)) and hollow whiskers of aluminum borates, which have square cross-sections (Y. G. Gogotsi et al, *Mater. Sci. Lett.* 11, 308–310 (1992)).

However, the graphitic polyhedra of the present invention are crystals with seven and more faces, preferably from 7 to 14 faces, more preferably 7, 9 and 11 faces. To the present inventors' knowledge, no similar crystals have been reported for any other material so far.

In the solid-state graphitization of amorphous carbon, crystallization starts in many places simultaneously to form randomly shaped faceted particles consisting of intergrown polycrystals. However, the graphitic polyhedra of the present invention are believed to grow originally from the gas phase in the formation of the glassy carbon starting material, and, thus, they are not polycrystals in this sense. Their folded and closed graphene planes differ from ordinary graphite but are similar to multiwall nanotubes, which can be thought of as tubular crystals of graphite. Thus, the present invention polyhedra could be considered as giant polyhedral nanotubes having a striking size and perfection (FIG. 1).

Although the present inventors do not wish to be bound to any particular mechanism of product growth, it is believed that the graphitic polyhedra nanotubes grew from C—H(N$_2$) gas trapped in pores during carbonization at about 2000° C.

or higher during the production of the GC. Although trace amounts of iron is often present in the material, EDS did not show any metal impurities in pores, thus lending support to a non-catalytic growth, similar to that of some carbon nanotubes, which can grow by addition of carbon hexagons, pentagons, and heptagons. Closure of the central (core) nanotube can occur due to pentagons giving rise to a curved geometry at the tip. Growth of GPC by both axial extension and radial thickening may result in pyramidal or rounded tip shapes (FIG. 1B). The high perfection of GPCs can be explained by their slow growth at temperatures of about 2000° C., which are higher than that for pyrolytic nanotubes (~1000° C.).

The graphitic polyhedra of the present invention have conductivity and optical properties similar to graphite. They have a high chemical stability and survive autoclave conditions that normally lead to complete dissolution of GC. The present invention polyhedra do not shatter in pieces when GC is crushed to reveal pore structures, or when hydrothermally treated samples are ground for TEM or Raman studies. There are no obvious fracture surfaces (except a few nanotube tips); although, edges and comers of some of particles can appear damaged. The presence of rings (FIG. 1E) suggests the possibility of pullout of the inner core as was observed for vapor-grown fibers. The graphitic polyhedra of the present invention have mechanical properties at least as good as conventional graphite whiskers (Young's modulus of ~800 GPa, and strength of ~20 GPa) along the axis, and preferably at least that of nanotubes (strength of about 30–50 GPa), more preferably approaching the theoretical limit for graphite of up to 80 GPa. Nanoindentation tests of polished pores containing graphitic polyhedra of the present invention gives hardness values up to 5.8 GPa compared to 3.2 GPa for glassy carbon and about 1 GPa for graphite. The Young's modulus of these regions is more than twice that of glassy carbon (49 and 23 GPa, respectively). The polyhedral structure of the present polyhedra provides a higher rigidity compared to a cylindrical nanotube. Core nanotubes of the present invention are straight and, preferably, do not bend under own weight or due to incorporated defects (FIG. 2A). Thus, the present invention polyhedra provide a better reinforcement to composites compared with cylindrical nanotubes, vapor-grown fibers and whiskers due to their faceted shape. The carbon shells in the present polyhedra cannot rotate relative to each other, providing significantly improved torsional stability. For twisted rods (FIG. 1C), "sword-in-sheath" failure (or telescoping of concentric sheets) will be prevented. However, even in axially symmetric crystals, toroidal edge termination can cross-link graphite layers and keep them together, increasing the strength of the whole particle.

The present graphitic polyhedra represent a new group of low-dimensional crystals with a variety of shapes. Thickening of nanotubes by addition of carbon layers results in microscopic GPC particles up to 1 µm in thickness with a perfect graphitic structure and unusual seven-fold, nine-fold and more complex axial morphological symmetry. Further growth of these crystals can also be performed to provide even larger structures, while preserving the polyhedral shapes.

In addition to the myriad of uses for conventional nanotubes and carbon whiskers, the polyhedra of the present invention can also be used in a variety of uses heretofore unknown or unattainable with conventional round cross section structures. In particular, due to their size and the presence of facets, the present graphitic polyhedra provide significant improvements in nano- and micro-probes for atomic force microscopy and other work. The present invention provides a probe comprising an isolated graphitic polyhedral crystal of the present invention having a plurality of graphite sheets arranged in a plurality of layers to form an elongated structure having a long axis and a diameter and having 7 or more external facets running substantially the length of the long axis, and having protruding from one end thereof a nanotube. The microscopy probe can be used for atomic force microscopy or other forms of micro and nanoscale manipulation. The facets provide higher stability to the probe, since the device that holds the probe has a flat surface onto which it can grasp, compared to a curved surface of a conventional circular cross section nanoprobe. Additionally, due to the large size of the preferred embodiments of the present graphitic polyhedral crystals, manipulation under optical microscope conditions is significantly improved, a big advantage over conventional nanoprobes.

Additionally, with the advent of micro and nano scale machines, the present polyhedra can be used as gears or cogs (due to the flat faced facets), particularly in the carbon rings which have not only facets on the exterior surface, but facets in the interior of the ring also. Thus the present invention provides a nanoscale gear assembly, comprising an isolated graphitic polyhedral crystal of the present invention comprising graphite sheets arranged in a plurality of layers to form an elongated structure having a long axis and a diameter and having 7 or more external facets running substantially the length of the long axis, wherein the crystal is in the form of a ring having a hollow center, through which is placed a nanorod as an axle. The nanorod axle can be a graphitic polyhedral crystal of the present invention having the same number of facets as the ring having the hollow center, or can have a circular cross-section of a size sufficient to fit inside the hollow center while preferably maintaining contact with the inner walls of the facets.

For the present invention polyhedra that have an axial twist, the polyhedra can be used in such nanoscale devices to provide a screw mechanism (similar to an extruder screw in a polymer extruder or similar to a guide that causes an object to travel along the axial direction as the screw turns (called herein a "nanoscale screw/traveler device" even though the scale may border between nanoscale and microscale). Such uses of nanotubes has never before been possible, since the existence of polyhedral nanotubes, both linear and twisted, has never before been known. Thus, the present invention also provides a nanoscale screw/traveler device, comprising a nanoscale screw means and a nanoscale traveler means, wherein said traveler means is in contact with at least a portion of an external surface of said screw means and will be caused to travel in a direction of a long axis of the screw means as the screw means rotates. In such a nanoscale screw/traveler device, the screw means is preferably an isolated graphitic polyhedral crystal of the present invention comprising graphite sheets arranged in a plurality of layers to form an elongated structure having a long axis and a diameter and having 7 or more external facets running substantially the length of the long axis, wherein the external facets undergo at least a partial helical twist along the length of the long axis.

An additional use for the graphitic polyhedral crystals of the present invention is as a reinforcement in a variety of matrices, as discussed above and well known by those of ordinary skill in the composite field with respect to conventional nanotubes and carbon whiskers. Accordingly, the present invention provides a reinforced matrix composite, comprising a matrix and a reinforcement, wherein the matrix is a member selected from the group consisting of ceramics, metals and polymers, and wherein the reinforcement is a graphitic polyhedral crystal comprising graphite sheets arranged in a plurality of layers to form an elongated structure having a long axis and a diameter and having 7 or more external facets running substantially the length of the long axis.

EXAMPLES

The preferred glassy carbon product used in the present examples was obtained from Toyo Tanso Co. of Japan as GL-200. The glassy carbon product (GC) was produced from phenolic resin by carbonization at approximately 2000° C. in $N_2$ atmosphere at ~10 torr. The density of GC was 1.48 g/cm$^3$ and open porosity <1%. Its microstructure and properties are typical of other GCs. Total content of impurities (Si, Al, Ca, Ti, V and Fe) was <100 ppm. Suitable methods for the production of such glassy carbons can be found in Ichishima et al, U.S. Pat. No. 5,868,850, Uwai et al, U.S. Pat. No. 5,993,596, and Lewis et al, U.S. Pat. No. 5,476,679, the contents of each of which are hereby incorporated by reference.

The GC was treated by hydrothermal treatment under 100 MPa at 750° C. for 24 h to dissolve the GC matrix and allow for separation of the stable graphitic polyhedral crystalline structures contained in the pores for TEM and Raman spectroscopy studies. The composition and structure of the graphitic polyhedra were examined using Raman spectroscopy, which is the most powerful technique for identifying carbon allotropes, and electron microscopy. A Renishaw 2000 Raman microspectrometer with an Ar ion laser (514.5 nm excitation wavelength) was used. The TEMs used were a JEOL 3010 (300 kV) with the lattice resolution of 0.14 nm and JEOL 2010F (200 kV) with the lattice resolution of 0.1 nm. High resolutions in the scanning mode were achieved using the JSM-6320 field emission SEM. This microscope was also fitted with a Noran Voyager EDX system with a light element X-ray detector analyzer. Particles were deposited onto a Si wafer or polished aluminum sample holder for Raman and SEM studies, or onto a lacey carbon grid for TEM analysis. Raman and SEM studies were also conducted on fracture surfaces of GC pieces.

The Raman spectra of FIG. 3 were taken by focusing the laser beam on an area of about 1 μm (circled on the SEM image); later, SEM and TEM images of the crystal were taken to better resolve its morphology. Absence of the D band in the sepctrum from the crystal face showed that the GPC is built of graphene sheets close to perfection. Raman bands at 184, 192, 843, 1350 and 1581 cm-1 (accompanied by shoulder bands at about 1565, 1600 and 1615 cm-1) were observed in the spectra from the crystal tip. The TEM micrograph shows the semicylindrical termination of graphite planes in the tip region, which is believed to produce nanotube-like bands in Raman spectra. Bent graphitic layers (marked by arrows in FIG. 3) look like two-layer nanotube tips in the cross section.

Hydrothermal Treatment Process Example

The hydrothermal treatment of the material, glassy carbon GL-200, was performed as follows: Hydrothermal treatment requires the use of inert vessel materials. Gold capsules, 3 mm in diameter are used to encapsulate a piece of the glassy carbon and water in the proportion 5 parts water to one part glassy carbon in the form a single rectangular piece previously cut to size using diamond cutting wheels followed by ultrasonication in demineralized water to remove cutting residue. The water and glassy carbon were sealed into the gold capsule by welding using a carbon electrode arc welder.

The prepared capsules were placed into Tuttle autoclaves and first pressurized to 100 MPa pressure using Argon gas as the pressurization gas, followed by heating to the treatment temperature of 800° C. over a 15 minute period. Treatment proceeds at 100 MPa and 800° C. for 48 hours after which the temperature is first lowered to room temperature followed by depressurization.

Examination of the glassy carbon surface reveals that the glassy carbon matrix reacts with the supercritical water in the capsule at a much higher rate than with the pore structures which are thus freed from the glassy carbon and found on the capsule walls or may be seen partially liberated but still attached to the surface of the glassy carbon.

The present application is based, in part, on Gogotsi et al, "Graphite Polyhedral Crystals", published in *Science*, 290, 317–320 (Oct. 13, 2000), the entire contents of which are hereby incorporated by reference.

Obviously, numerous modifications and variations of the present invention are possible in light of the above teachings. It is therefore to be understood that within the scope of the appended claims, the invention may be practiced otherwise than as specifically described herein.

What is claimed is:

1. An isolated graphitic polyhedral crystal comprising graphite sheets arranged in a plurality of layers to form an elongated structure having a long axis and a diameter and having 7 or more external facets running substantially the length of the long axis, wherein the diameter is from 5 nm to 1000 nm and the external facets are of substantially equal size, and wherein the crystal is in a form selected from the group consisting of needles, giant nanotubes, rings, cones, double tipped pyramids, nanorods and whiskers.

2. The isolated graphitic polyhedral crystal of claim 1, wherein the crystal has from 7 to 14 external facets.

3. The isolated graphitic polyhedral crystal of claim 2, wherein the crystal has 7, 9 or 11 external facets.

4. The isolated graphitic polyhedral crystal of claim 3, wherein the crystal has 9 external facets.

5. The isolated graphitic polyhedral crystal of claim 1, wherein said long axis is from 100 nm to 5 microns in length.

6. The isolated graphitic polyhedral crystal of claim 1, wherein said external facets run axially true.

7. The isolated graphitic polyhedral crystal of claim 1, wherein said external facets undergo at least a partial helical twist along the length of the long axis.

8. The isolated graphitic polyhedral crystal of claim 1, wherein the crystal is in the form of a needle.

9. The isolated graphitic polyhedral crystal of claim 1, wherein the crystal is in the form of a giant nanotube.

10. The isolated graphitic polyhedral crystal of claim 1, wherein the crystal is in the form of a ring.

11. The isolated graphitic polyhedral crystal of claim 1, wherein the crystal is in the form of a cone.

12. The isolated graphitic polyhedral crystal of claim 1, wherein the crystal is in the form of a double tipped pyramid.

13. The isolated graphitic polyhedral crystal of claim 1, wherein the crystal is in the form of a nanorod.

14. The isolated graphitic polyhedral crystal of claim 1, wherein the crystal is in the form of a whisker.

15. A microscopy probe comprising a graphitic polyhedral crystal having a plurality of graphite sheets arranged in a plurality of layers to form an elongated structure having a long axis and a diameter and having 7 or more external facets running substantially the length of the long axis, and having protruding from one end thereof a nanotube.

16. A nanoscale gear assembly, comprising a graphitic polyhedral crystal comprising graphite sheets arranged in a plurality of layers to form an elongated structure having a long axis and a diameter and having 7 or more external facets running substantially the length of the long axis, wherein the crystal is in the form of a ring having a hollow center, through which is placed a nanorod as an axle.

17. A reinforced matrix composite, comprising a matrix and a reinforcement, wherein said matrix is a member selected from the group consisting of ceramics, metals and polymers, and wherein said reinforcement is a graphitic polyhedral crystal comprising graphite sheets arranged in a plurality of layers to form an elongated structure having a long axis and a diameter and having 7 or more external facets running substantially the length of the long axis, wherein the diameter is from 5 nm to 1000 nm and the external facets are of substantially equal size, and wherein the crystal is in a form selected from the group consisting of needles, giant nanotubes, rings, cones, double tipped pyramids, nanorods and whiskers.

18. The reinforced matrix composite of claim 17, wherein the crystal has from 7 to 14 external facets.

19. The reinforced matrix composite of claim 18, wherein the crystal has 7, 9 or 11 external facets.

20. The reinforced matrix composite of claim 19, wherein the crystal has 9 external facets.

21. The reinforced matrix composite of claim 17, wherein said long axis is from 100 nm to 5 microns in length.

22. The reinforced matrix composite of claim 17, wherein said external facets undergo at least a partial helical twist along the length of the long axis.

23. The reinforced matrix composite of claim 17, wherein the crystal is in the form of a needle.

24. The reinforced matrix composite of claim 17, wherein the crystal is in the form of a giant nanotube.

25. The reinforced matrix composite of claim 17, wherein the crystal is in the form of a ring.

26. The reinforced matrix composite of claim 17, wherein the crystal is in the form of a cone.

27. The reinforced matrix composite of claim 17, wherein the crystal is in the form of a double tipped pyramid.

28. The reinforced matrix composite of claim 17, wherein the crystal is in the form of a nanorod.

29. The reinforced matrix composite of claim 17, wherein the crystal is in the form of a whisker.

30. The reinforced matrix composite of claim 17, wherein the matrix is a ceramic.

31. The reinforced matrix composite of claim 17, wherein the matrix is a polymer.

32. A reinforced matrix composite, comprising a matrix and a reinforcement, wherein said matrix is a member selected from the group consisting of ceramics, metals and polymers, and wherein said reinforcement is a graphitic polyhedral crystal comprising graphite sheets arranged in a plurality of layers to form an elongated structure having a long axis and a diameter and having 7 or more external facets running substantially the length of the long axis, wherein said external facets run axially true.

33. A reinforced matrix composite, comprising a matrix and a reinforcement, wherein said matrix is a member selected from the group consisting of ceramics, metals and polymers, and wherein said reinforcement is a graphitic polyhedral crystal comprising graphite sheets arranged in a plurality of layers to form an elongated structure having a long axis and a diameter and having 7 or more external facets running substantially the length of the long axis, wherein the matrix is a metal.

\* \* \* \* \*